(12) United States Patent
Huang et al.

(10) Patent No.: US 12,300,670 B2
(45) Date of Patent: May 13, 2025

(54) HYBRID BOND PAD STRUCTURE

(71) Applicant: Taiwan Semiconductor Manufacturing Company, Ltd., Hsin-Chu (TW)

(72) Inventors: Sin-Yao Huang, Tainan (TW); Chun-Chieh Chuang, Tainan (TW); Ching-Chun Wang, Tainan (TW); Sheng-Chau Chen, Tainan (TW); Dun-Nian Yaung, Taipei (TW); Feng-Chi Hung, Chu-Bei (TW); Yung-Lung Lin, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/355,524

(22) Filed: Jul. 20, 2023

(65) Prior Publication Data
US 2023/0361085 A1    Nov. 9, 2023

Related U.S. Application Data

(60) Continuation of application No. 17/333,120, filed on May 28, 2021, now Pat. No. 11,804,473, which is a
(Continued)

(51) Int. Cl.
*H01L 25/065* (2023.01)
*H01L 23/00* (2006.01)
(Continued)

(52) U.S. Cl.
CPC .... *H01L 25/0657* (2013.01); *H01L 23/49838* (2013.01); *H01L 24/00* (2013.01);
(Continued)

(58) Field of Classification Search
None
See application file for complete search history.

(56) References Cited

U.S. PATENT DOCUMENTS 8,298,860 B2 * 10/2012 Gambino ............... G06F 30/39
                                                    438/107
8,435,824 B2   5/2013 Tsai et al.
(Continued)

FOREIGN PATENT DOCUMENTS

| CN | 102651350 A  | 8/2012  |
|----|--------------|---------|
| TW | 200950046 A  | 12/2009 |
| TW | 201125097 A  | 7/2011  |

OTHER PUBLICATIONS

Ex-Parte Quayle Office Action dated Dec. 27, 2016 for U.S. Appl. No. 14/750,003.
(Continued)

*Primary Examiner* — Long Pham
(74) *Attorney, Agent, or Firm* — Eschweiler & Potashnik, LLC

(57) ABSTRACT

In some embodiments, the present disclosure relates to an integrated chip structure. The integrated chip structure includes a first integrated chip (IC) tier and a second IC tier. The second IC tier comprises a second plurality of conductors within a second insulating structure disposed on the second semiconductor body. A conductive pad is electrically coupled to the second plurality of conductors and has a conductive surface available to a side of the second semiconductor body facing away from the first semiconductor body. The IC first tier contacts the second IC tier along a bonding interface including one or more conductive regions and one or more insulating regions. The one or more conductive regions laterally outside of a bottom surface of the conductive pad.

20 Claims, 10 Drawing Sheets

Related U.S. Application Data continuation of application No. 16/367,720, filed on Mar. 28, 2019, now Pat. No. 11,024,602, which is a division of application No. 15/626,834, filed on Jun. 19, 2017, now Pat. No. 10,269,770, which is a continuation of application No. 14/750,003, filed on Jun. 25, 2015, now Pat. No. 9,704,827.

(51) Int. Cl.
  *H01L 23/498* (2006.01)
  *H01L 25/00* (2006.01)
  *H10F 39/00* (2025.01)
  *H01L 23/52* (2006.01)

(52) U.S. Cl.
  CPC .......... *H01L 25/50* (2013.01); *H10F 39/809* (2025.01); *H10F 39/811* (2025.01); *H01L 23/52* (2013.01); *H01L 24/05* (2013.01); *H01L 24/08* (2013.01); *H01L 24/80* (2013.01); *H01L 2224/05569* (2013.01); *H01L 2224/05571* (2013.01); *H01L 2224/05573* (2013.01); *H01L 2224/05624* (2013.01); *H01L 2224/05647* (2013.01); *H01L 2224/08147* (2013.01); *H01L 2224/80357* (2013.01); *H01L 2224/80815* (2013.01); *H01L 2225/06513* (2013.01); *H01L 2225/06544* (2013.01)

(56) References Cited

U.S. PATENT DOCUMENTS

| | | | | |
|---|---|---|---|---|
| 8,492,265 | B2 * | 7/2013 | Yang | H01L 24/92 438/618 |
| 9,337,235 | B2 | 5/2016 | Chen et al. | |
| 9,406,561 | B2 * | 8/2016 | Farooq | H01L 25/0657 |
| 9,704,827 | B2 | 7/2017 | Huang et al. | |
| 10,269,852 | B2 * | 4/2019 | Liu | H01L 27/14689 |
| 2002/0079584 | A1 | 6/2002 | Matsunaga | |
| 2009/0134497 | A1 | 5/2009 | Barth et al. | |
| 2009/0224345 | A1 * | 9/2009 | Lee | H01L 27/14687 257/E31.127 |
| 2009/0275165 | A1 | 11/2009 | Pourquier | |
| 2010/0096760 | A1 | 4/2010 | Yu et al. | |
| 2011/0210413 | A1 | 9/2011 | Huang et al. | |
| 2012/0161275 | A1 * | 6/2012 | Gambino | H01L 25/0657 257/774 |
| 2012/0190187 | A1 * | 7/2012 | Yang | H01L 24/03 257/E21.585 |
| 2015/0061102 | A1 * | 3/2015 | Lin | H01L 21/76898 257/692 |
| 2015/0115131 | A1 | 4/2015 | Webster et al. | |

OTHER PUBLICATIONS

Notice of Allowance dated March 1, 207 for U.S. Appl. No. 14/750,003.
Non-Final Office Action dated May 30, 2018 for U.S. Appl. No. 15/626,834.
Final Office Action dated Oct. 4, 2018 for U.S. Appl. No. 15/626,834.
Notice of Allowance dated Dec. 7, 2018 for U.S. Appl. No. 15/626,834.
Non-Final Office Action dated Jul. 8, 2020 for U.S. Appl. No. 16/367,720.
Final Office Action dated Nov. 12, 2020 for U.S. Appl. No. 16/367,720.
Notice of Allowance dated Feb. 1, 2021 for U.S. Appl. No. 16/367,720.
Non-Final Office Action dated Nov. 16, 2022 for U.S. Appl. No. 17/333,120.
Final Office Action dated Apr. 19, 2023 for U.S. Appl. No. 17/333,120.
Notice of Allowance dated Jun. 28, 2023 for U.S. Appl. No. 17/333,120.

* cited by examiner

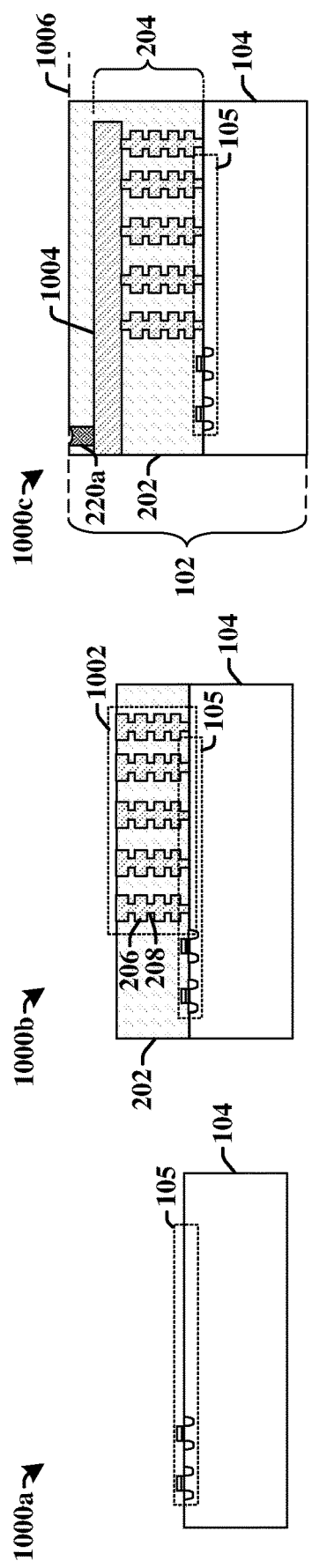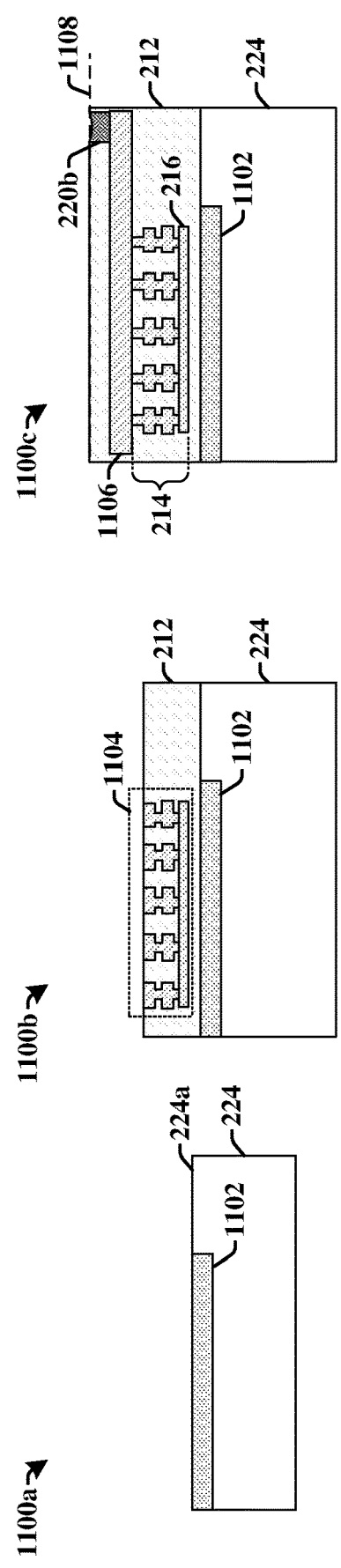

HYBRID BOND PAD STRUCTURE

REFERENCE TO RELATED APPLICATIONS

This Application is a Continuation of U.S. application Ser. No. 17/333,120, filed on May 28, 2021, which is a Continuation of U.S. application Ser. No. 16/367,720, filed on Mar. 28, 2019 (now U.S. Pat. No. 11,024,602, issued on Jun. 1, 2021), which is a Divisional of U.S. application Ser. No. 15/626,834, filed on Jun. 19, 2017 (now U.S. Pat. No. 10,269,770, issued on Apr. 23, 2019), which is a Continuation of U.S. application Ser. No. 14/750,003, filed on Jun. 25, 2015 (now U.S. Pat. No. 9,704,827, issued on Jul. 11, 2017). The contents of the above-referenced Patent Applications are hereby incorporated by reference in their entirety.

BACKGROUND

A multi-dimensional integrated chip is an integrated circuit having multiple substrates or die which are vertically stacked onto and electrically interconnected to one another. By electrically interconnecting the stacked substrates or die, the multi-dimensional integrated chip acts as a single device, which provides improved performance, reduced power consumption, and a reduced footprint over convention integrated chips. Therefore, multi-dimensional integrated chips provide a path to continue to meet the performance/cost demands of next-generation integrated circuits without further lithographic scaling.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-6 illustrate some alternative embodiments of a stacked integrated chip having a back-side bond pad.

FIGS. 10A-17 illustrate some embodiments of cross-sectional views showing a method of forming a stacked integrated chip having a back-side bond pad.

DETAILED DESCRIPTION

Figure 1:
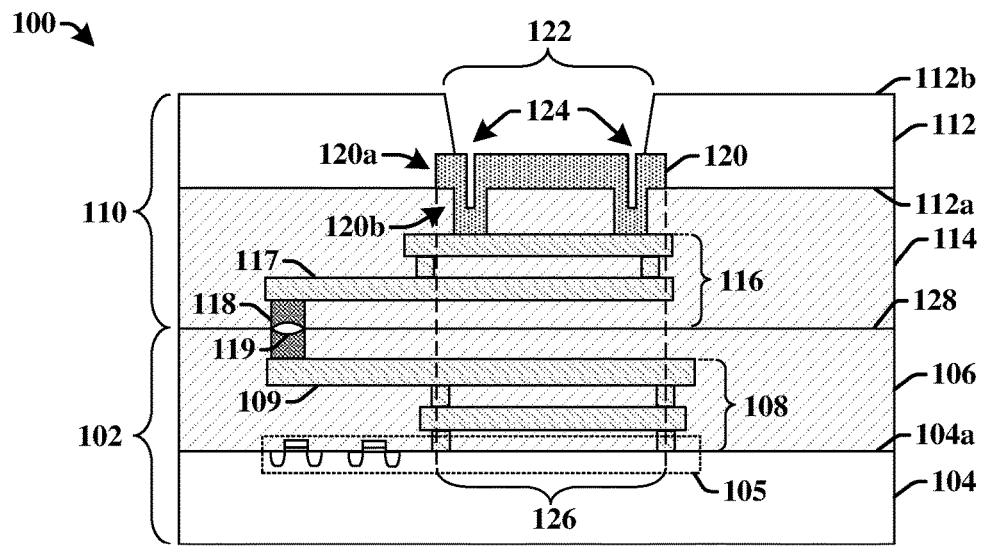
FIG. 1 illustrates some embodiments of a stacked integrated chip having a back-side bond pad.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Three-dimensional integrated chips (3DIC) are manufactured by stacking a plurality of integrated chip die on top of one another. The plurality of integrated chip die are separately produced by forming one or more metallization layers within ILD layers overlying separate semiconductor substrates. One or more redistribution layers are then formed within the ILD layers over the metallization layers and a planarization process (e.g., a chemical mechanical polishing process) is performed to form a planar surface comprising the redistribution layers and the ILD layer. The planar surfaces of the separate integrated chip die are then brought together so that the redistribution layers of the separate integrated chip die abut. A bond pad is subsequently produced within a recess vertically extending through an upper substrate to an underlying metallization layer, so as to provide an electrical connection between the bond pad and the multi-dimensional integrated chip.

When the planarization process is performed on the separate integrated chip die, an upper surface of the redistribution layer may 'dish' to form a concave surface that drops below the surrounding ILD layer. When the planar surfaces of two integrated chip die are subsequently brought together, the concave surfaces come together to form one or more bubbles at the interface of the two integrated chip die. The bubbles structurally weaken a region below the bond pad, such that if a force used to form a bonding structure onto the bond pad is too large, the structure underlying the bond pad may crack and damage the multi-dimensional integrated chip.

The present disclosure relates to a multi-dimensional integrated chip having a redistribution layer vertically extending between integrated chip die, which is laterally offset from a back-side bond pad, and a corresponding method of formation. In some embodiments, the multi-dimensional integrated chip has a first integrated chip die with a first plurality of metal interconnect layers disposed within a first inter-level dielectric (ILD) layer arranged onto a front-side of a first semiconductor substrate. The multi-dimensional integrated chip also has a second integrated chip die with a second plurality of metal interconnect layers disposed within a second ILD layer abutting the first ILD layer. A bond pad is disposed within a recess extending through the second semiconductor substrate. A redistribution layer vertically extends between the first plurality of metal interconnect layers and the second plurality of metal interconnect layers at a position that is laterally offset from the bond pad. Since the redistribution layer is laterally offset from the bond pad, a region underlying the bond pad is devoid of bubbles along the interface between the first integrated chip die and the second integrated chip die. Without bubbles underlying the bond pad, the structural integrity of the bond pad is increased, thereby reducing cracking and damage to the multi-dimensional integrated chip.

FIG. 1 illustrates some embodiments of a stacked integrated chip 100 having a back-side bond pad.

The stacked integrated chip 100 comprises a first integrated chip die 102 and a second integrated chip die 110. The first integrated chip die 102 comprises a first back-end-of-the-line (BEOL) metallization stack 108 arranged onto a front-side 104a of a first semiconductor substrate 104. The first BEOL metallization stack 108 comprises one or more metal interconnect layers arranged within a first inter-layer dielectric (ILD) layer 106 comprising one or more ILD materials (e.g., a low-k dielectric material, silicon dioxide, etc.). In some embodiments, the first semiconductor substrate 104 may comprise a device region 105 having a plurality of semiconductor devices (e.g., transistor devices, capacitors, inductors, etc.) and/or MEMs devices.

The second integrated chip die 110 comprises a second back-end-of-the-line (BEOL) metallization stack 116 arranged onto a front-side 112a of a second semiconductor substrate 112. The second BEOL metallization stack 116 has one or more metal interconnect layers arranged within a second ILD layer 114 comprising one or more ILD materials. In some embodiments, the second semiconductor substrate 112 may comprise integrated chip devices, imaging devices, or MEMs devices, for example. The first integrated chip die 102 is vertically stacked onto the second integrated chip die 110 in a face-to-face (F2F) configuration, such that the first ILD layer 106 abuts the second ILD layer 114.

A bond pad 120, which is in electrical contact with the second BEOL metallization stack 116, is arranged within a recess 122 that extends through a portion of the second semiconductor substrate 112 (e.g., from the front-side 112a of the substrate to a back-side 112b of the substrate). The bond pad 120 comprises a conductive material (e.g., a metal such as aluminum) and has an upper surface that is exposed by the recess 122. The bond pad 120 is configured to provide an electrical connection between the stacked integrated chip 100 and an external device. For example, a solder bump (not shown) may be formed onto the bond pad 120 to connect the bond pad 120 to an external I/O pin of an integrated chip package. In some embodiments, the bond pad 120 may comprise a slotted bond pad. The slotted bond pad comprises protrusions 120b extending vertically outward from a lower surface of a base region 120a to an underlying metal interconnect layer within the second BEOL metallization stack 116. In some embodiments, pad openings 124 are arranged within an upper surface of the base region 120a. The pad openings 124 may vertically extend to within the protrusions 120b.

A first metal routing layer 109 disposed within the first BEOL metallization stack 108 extends laterally outward from a bond pad area 126 underlying the bond pad 120. In some embodiments, within the bond pad area 126 the first BEOL metallization stack 108 and/or the second BEOL metallization stack 116 may be a solid bond pad having metal vias arranged between one or more solid metal wire layers (e.g., a solid intermediate metal wire layer and/or a solid top metal wire layer). In other embodiments, within the bond pad area 126 the first BEOL metallization stack 108 and/or the second BEOL metallization stack 116 may be a slotted bond pad having metal vias arranged between one or more slotted metal wire layers (e.g., a slotted intermediate metal wire layer and/or a slotted top metal wire layer). In some embodiments, the first metal routing layer 109 laterally extends beyond an adjacent metal wire layer. Similarly, a second metal routing layer 117 disposed within the second BEOL metallization stack 116 laterally extends outward from the bond pad area 126 in a same direction as the first metal routing layer 109.

The first metal routing layer 109 is electrically connected to the second metal routing layer 117 by way of a redistribution structure 118 that is laterally offset from the bond pad 120. The redistribution structure 118 comprises a conductive material that vertically extends from within the first ILD layer 106 to within the second ILD layer 114. In some embodiments, the redistribution structure 118 may comprise copper and/or aluminum, for example. Since the redistribution structure 118 is laterally offset from the bond pad 120, the bond pad area 126 is devoid of routing between the first BEOL metallization stack 108 and the second BEOL metallization stack 116.

In some embodiments, the redistribution structure 118 may comprise a bubble or void 119 arranged along an interface 128 between the first integrated chip die 102 and the second integrated chip die 110. However, since the redistribution structure 118 is laterally offset from the bond pad area 126, the bond pad area 126 is devoid of void along the interface between the first integrated chip die 102 and the second integrated chip die 110. Without voids underlying the bond pad 120, a bonding structure (e.g., a wirebond ball) can be formed onto the bond pad 120 without damaging the underlying structure of stacked integrated chip 100.

Figures 2A, 2B:
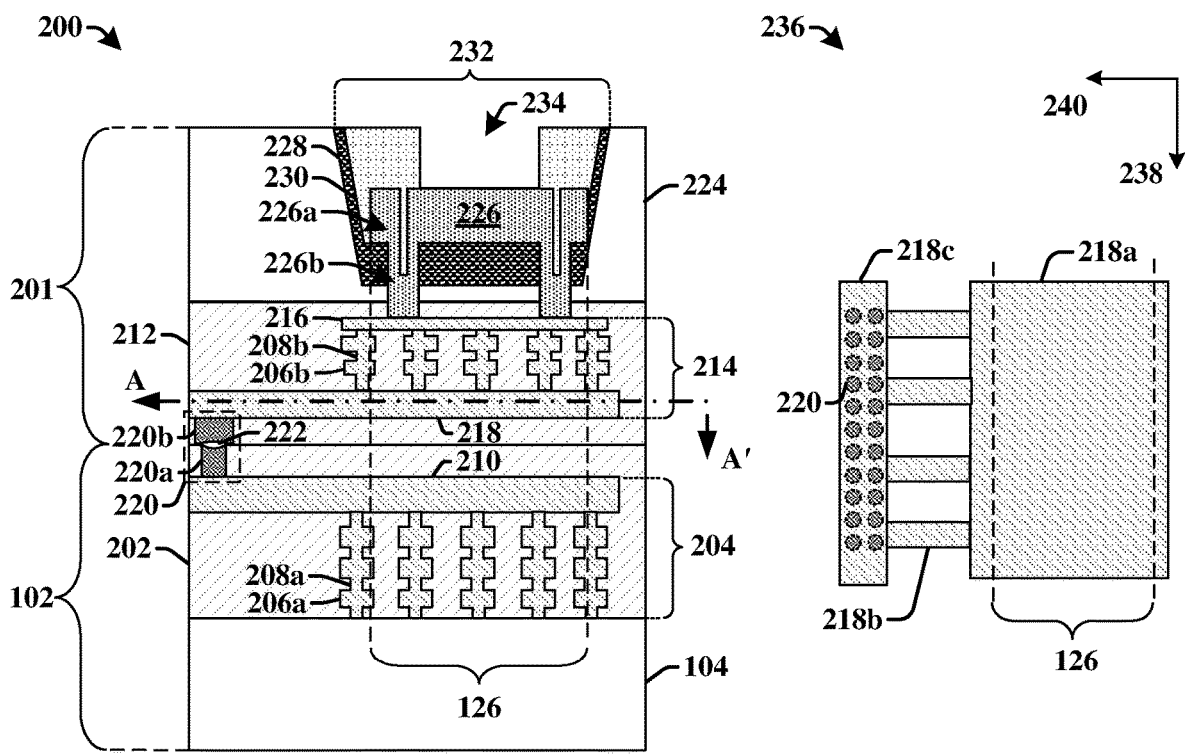

FIG. 2A illustrates a cross-sectional view of some additional embodiments of a stacked integrated chip 200 having a back-side bond pad.

The stacked integrated chip 200 comprises a first integrated chip die 102, and a second integrated chip die 201 that is vertically stacked onto the first integrated chip die 102 in a F2F configuration. The first integrated chip die 102 comprises a first BEOL metallization stack 204 disposed within a first ILD layer 202 arranged onto a front-side of a first semiconductor substrate 104. The first BEOL metallization stack 204 includes a first plurality of metal interconnect layers comprising alternating layers of metal wires 206a (configured to provide lateral connections) and metal vias 208a (configured to provide vertical connections). The first plurality of metal interconnect layers further include a first upper metal wire layer 210 (e.g., a top metal wire layer within the first BEOL metallization stack 204) that laterally extends to a position outside of a bond pad area 126 (e.g., to a position that is laterally offset from slotted bond pad 226).

The second integrated chip die 201 comprises a second BEOL metallization stack 214 disposed within a second ILD layer 212 arranged onto a front-side of a second semiconductor substrate 224. The second BEOL metallization stack 214 includes a second plurality of metal interconnect layers comprising a bond pad layer 216 and a second upper metal wire layer 218 (e.g., a top metal wire layer within the second BEOL metallization stack 214) vertically separated by one or more metal wires 206b and metal vias 208b. In some embodiments, the bond pad layer 216 may comprise a first metal interconnect layer (e.g., a "lowest" metal wire layer within the second BEOL metallization stack 214). The second upper metal wire layer 218 laterally extends to a position outside of a bond pad area 126 (e.g., to a position that is laterally offset from slotted bond pad 226).

The first and second plurality of metal interconnect layers are stacked onto one another in a bond pad configuration, which has the metal wires 206 and metal vias 208 stacked vertically onto one another to provide structural stability for the overlying slotted bond pad 226. The stacked metal vias 208 are laterally aligned between different metal vias layers. In some embodiments, the metal wires 206 and metal vias 208 may be arranged in a periodic pattern. In some embodiments, the first and/or second plurality of metal interconnect layers may have a slotted structure. In such embodiments, the metal wires 206b and metal vias 208b within the second plurality of metal interconnect layers may have a plurality of column structures laterally separated from one another and vertically extending between the second upper metal wire layer 218 and the bond pad layer 216. In other embodiments, the first and/or second plurality of metal interconnect layers may have metal wires with a solid structure. In such embodiments, the metal wires 206b between the second upper metal wire layer 218 and the bond pad layer 216 may comprise a solid structure laterally extending between a plurality of metal vias 208b on a same metal via layer. In some embodiments, the first upper metal wire layer 210 and the second upper metal wire layer 218 extend laterally past the other plurality of metal interconnect layers in the bond pad configuration.

In some embodiments, the first ILD layer 202 and the second ILD layer 212 may comprise one or more of a low-k dielectric (i.e., a dielectric with a dielectric constant less than about 3.9), an ultra low-k dielectric, or an oxide. In some embodiments, the first and second plurality of metal interconnect layers may comprise as aluminum, copper, tungsten, or some other metal.

A redistribution structure 220 configured to provide an electrical connection between the first BEOL metallization stack 204 and the second BEOL metallization stack 214 is located at a position that is laterally offset from the bond pad area 126 (e.g., a position that is laterally offset from slotted bond pad 226). The redistribution structure 220 comprises a first redistribution layer 220a and a second redistribution layer 220b. The first redistribution layer 220a abuts the first upper metal wire layer 210 at a position laterally outside of a bond pad area 126. The second redistribution layer 220b abuts the second upper metal wire layer 218 at a position laterally outside of a bond pad area 126. In some embodiments, the first redistribution layer 220a and the second redistribution layer 220b have concave surfaces that meet to form a bubble 222 at an interface between the stacked integrated chip die.

A recess 232 is arranged in a back-side of the second semiconductor substrate 224. A buffer layer 228 is disposed along interior surfaces of the recess 232. In some embodiments, the buffer layer 228 is confined to the recess 232. In other embodiments, the buffer layer 228 may extend outward from the recess 232. In some embodiments, the buffer layer 228 may comprise a single or multi-layer dielectric film including an oxide (e.g., silicon dioxide), a nitride (e.g., silicon nitride), and/or a high k dielectric (i.e., having a dielectric constant greater than about 3.9).

A slotted bond pad 226 is disposed within the recess 232 at a position overlying the buffer layer 228. The slotted bond pad 226 comprises protrusions 226b vertically extending outward from a base region 226a, through the buffer layer 228, to the bond pad layer 216. In various embodiments, the slotted bond pad 226 may comprise a conductive material, such as copper and/or aluminum, for example. A dielectric layer 230 is arranged within the recess 232 at a location over the slotted bond pad 226. In some embodiments, the dielectric layer 230 may comprise an oxide, such as silicon dioxide. An opening 234 vertically extends through the dielectric layer 230 to expose an upper surface of the slotted bond pad 226.

FIG. 2B illustrates a top-view 236 of some embodiments of the stacked integrated chip 200 shown along line A-A' of FIG. 2A.

As shown in top-view 236, the second upper metal wire layer 218 may comprise a solid bond pad configuration having a metal plate 218a within the bond pad area 126 underlying the slotted bond pad (e.g., 226 of FIG. 2A). Extensions 218b protrude outward from the metal plate 218a to a redistribution landing area 218c configured to make contact with a plurality of redistribution structures 220. In some embodiments, the metal plate 218a and the redistribution landing area 218c continuously extend in a first direction 238 along multiple extensions 218b extending along a second direction 240 and separated from one another in the first direction 238.

It will be appreciated that top-view 236 is a non-limiting example of the second upper metal wire layer 218 for a solid bond pad configuration. In other embodiments, the second upper metal wire layer 218 may have an alternative structure, such as for example a non-solid structure for a slotted bond pad configuration.

Figure 3:
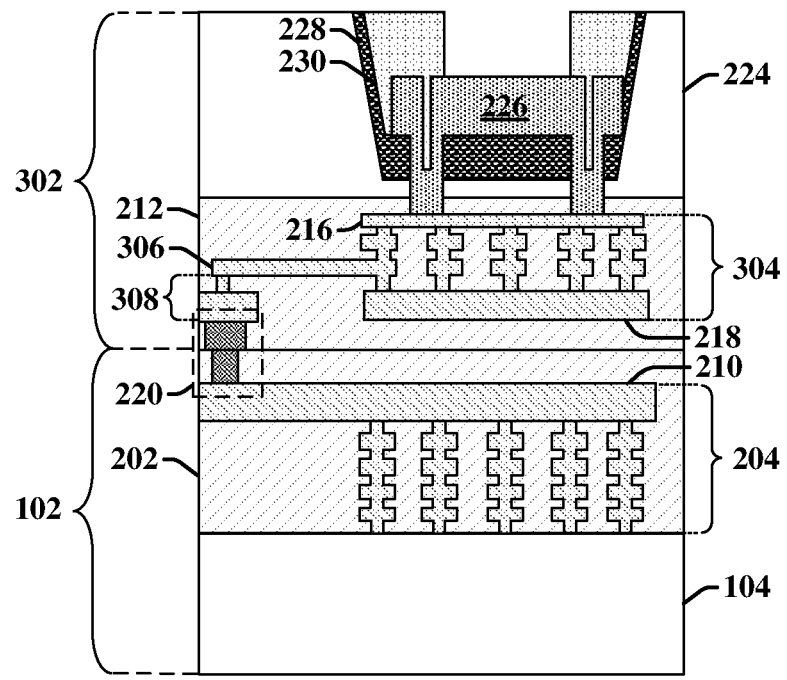

FIG. 3 illustrates some alternative embodiments of a stacked integrated chip 300 having a back-side bond pad.

The stacked integrated chip 300 comprises a first integrated chip die 102, and a second integrated chip die 302 vertically stacked onto the first integrated chip die 102. The first integrated chip die 102 comprises a first BEOL metallization stack 204 having a first upper metal wire layer 210 that horizontally extends to a position that is laterally offset from a slotted bond pad 226. The second integrated chip die 302 comprises a second BEOL metallization stack 304 comprising an intermediate metal interconnect layer 306 vertically arranged between a bond pad layer 216 (that abuts the slotted bond pad 226) and a second upper metal wire layer 218. The intermediate metal interconnect layer 306 horizontally extends to a position laterally offset from the slotted bond pad 226.

A redistribution structure 220 forms an electrical connection extending between the first upper metal wire layer 210 and the intermediate metal interconnect layer 306 at a position that is laterally offset from the slotted bond pad 226. The redistribution structure 220 comprises a first redistribution layer 220a abutting the first upper metal wire layer 210, and a second redistribution layer 220b connected to the intermediate metal interconnect layer 306 by way of one or more connecting metal interconnect layers 308.

Figure 4:
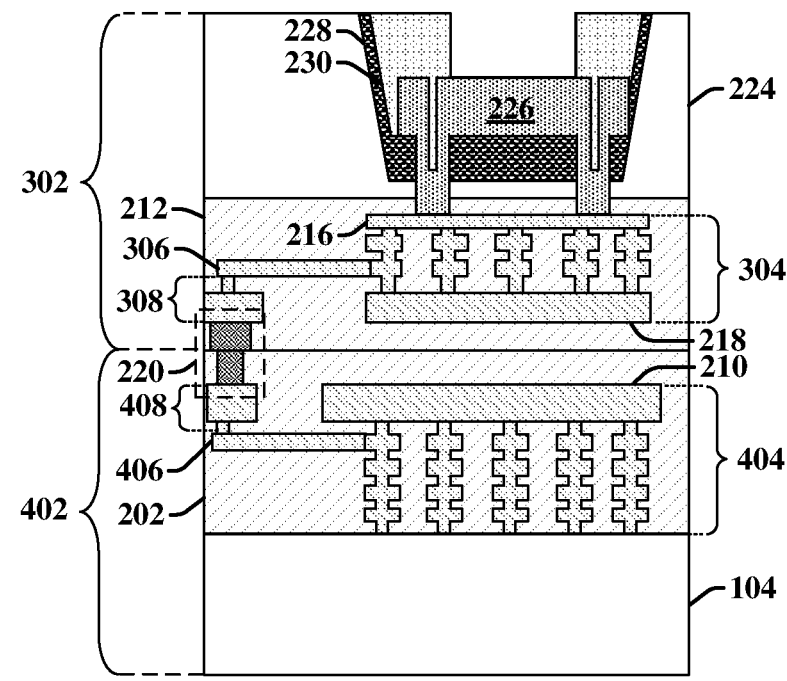

FIG. 4 illustrates some alternative embodiments of a stacked integrated chip 400 having a back-side bond pad.

The stacked integrated chip 400 comprises a first integrated chip die 402, and a second integrated chip die 302 vertically stacked onto the first integrated chip die 402. The first integrated chip die 402 comprises a first BEOL metallization stack 404 having a first intermediate metal interconnect layer 406 vertically arranged between a first semiconductor substrate 104 and a first upper metal wire layer 210. The first intermediate metal interconnect layer 406 horizontally extends to a position that is laterally offset from slotted bond pad 226. The second integrated chip die 302 comprises a second BEOL metallization stack 304 comprising a second intermediate metal interconnect layer 306 vertically arranged between a bond pad layer 216 and a second upper metal wire layer 218. The second intermediate metal interconnect layer 306 horizontally extends to a position that is laterally offset from the slotted bond pad 226.

A redistribution structure 220 forms an electrical connection extending between first intermediate metal interconnect layer 406 and the second intermediate metal interconnect layer 306 at a position that is laterally offset from the slotted bond pad 226. The redistribution structure 220 comprises a first redistribution layer 220a connected to the first intermediate metal interconnect layer 406 by way of one or more first connecting metal interconnect layers 408, and a second redistribution layer 220b connected to the second intermediate metal interconnect layer 306 by way of one or more second connecting metal interconnect layers 308.

Figure 5:
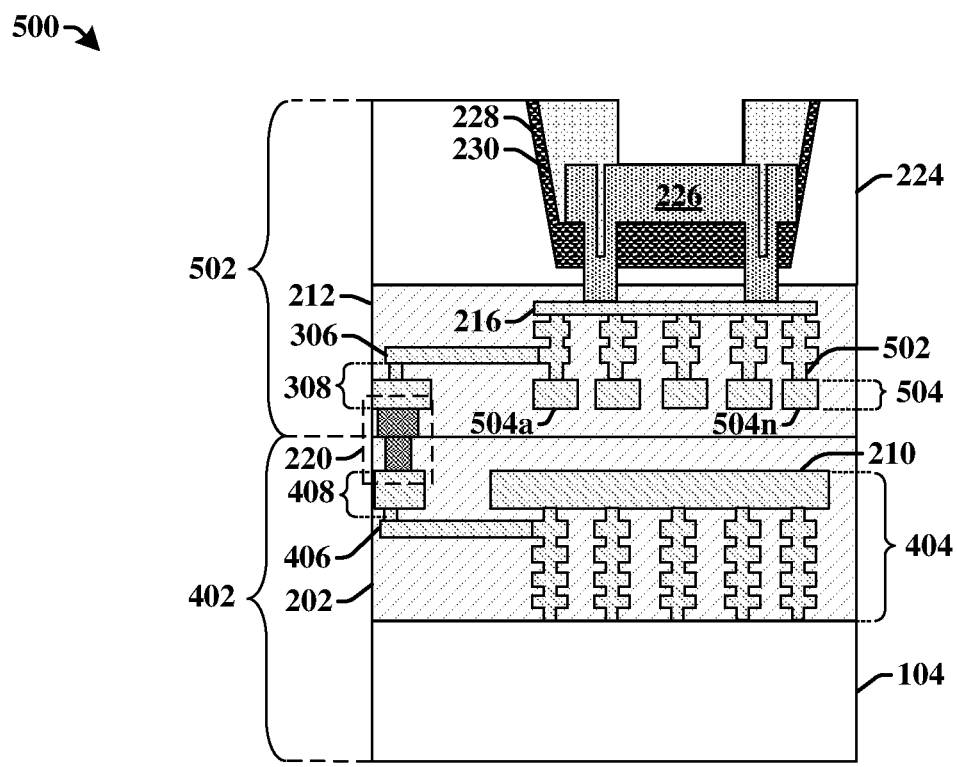

FIG. 5 illustrates some alternative embodiments of a stacked integrated chip 500 having a back-side bond pad.

The stacked integrated chip 500 comprises a first integrated chip die 402, and a second integrated chip die 502 vertically stacked onto the first integrated chip die 402. The second integrated chip die 502 has an upper metal wire layer 504 comprising a slotted structure. The slotted structure comprises a plurality of segments 504a-504n that are laterally separated from one another. The plurality of segments 504a-504n are respectively connected to adjacent metal vias 208, which couple one or more of the plurality of segments 504a-504n to a second intermediate metal interconnect layer 306 coupled to a redistribution structure 220.

Figure 6:
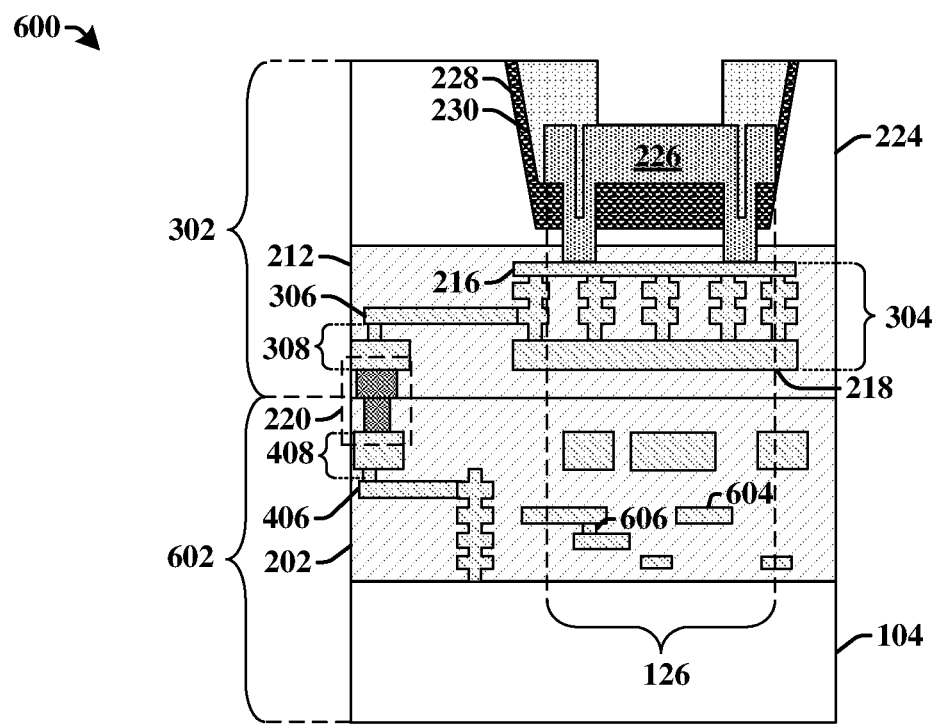

FIG. 6 illustrates a cross-sectional view of some alternative embodiments of a stacked integrated chip 600 having a back-side bond pad.

The stacked integrated chip 600 comprises a first integrated chip die 602, and a second integrated chip die 302 vertically stacked onto the first integrated chip die 602. The second integrated chip die 302 has a second plurality of metal interconnect layers stacked onto one another in a bond pad configuration (e.g., in a slotted or solid pad configuration), which has the metal wires and metal vias stacked vertically onto one another to provide structural stability for an overlying slotted bond pad 226. The first integrated chip die 602 comprises a plurality of metal wire layers 604 and metal via layers 606 configured to provide routing for integrated circuit logic elements. The plurality of metal wire layers 604 and metal via layers 606 are not arranged in a bond pad configuration. For example, the metal via layers 606 (e.g., a first via layer and an overlying second via layer) are not aligned in a lateral direction within a bond pad area 126 underlying the slotted bond pad 226.

Figure 7:
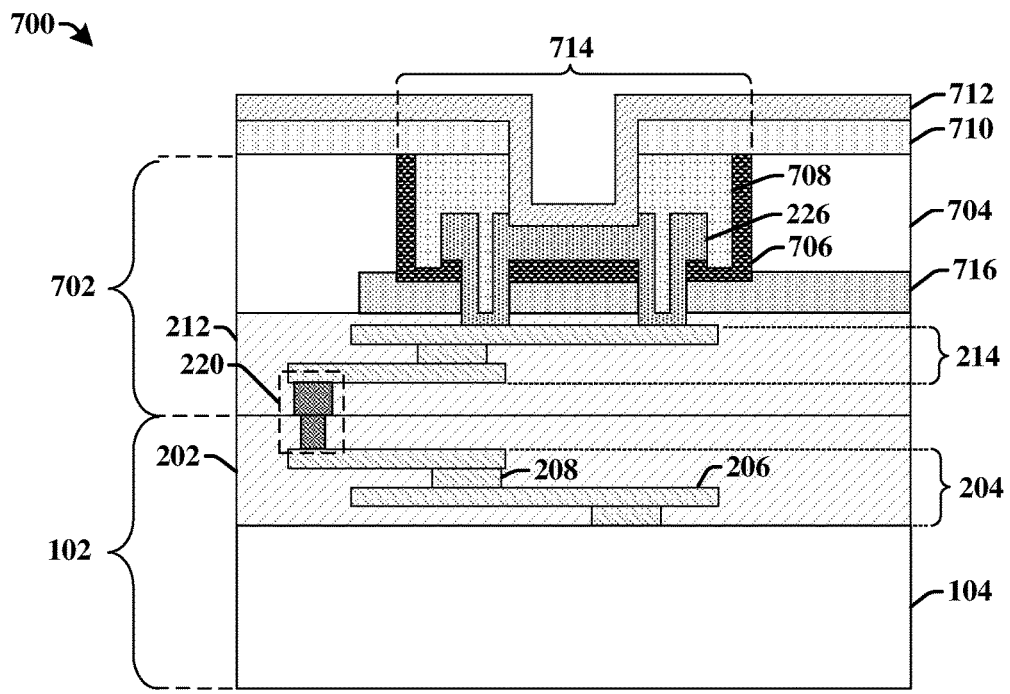
FIG. 7 illustrates some additional embodiments of a stacked integrated chip image sensor having a back-side bond pad for a back-side illuminated (BSI) image sensor.

FIG. 7 illustrates some additional embodiments of a back side illumination (BSI) image sensor 700 having a back-side bond pad.

The BSI image sensor 700 comprises a first integrated chip die 102 and a second integrated chip die 702, which is vertically stacked onto the first integrated chip die 102. The second integrated chip die 702 comprises a second semiconductor substrate 704 and an isolation region 716. The second semiconductor substrate 704 and the isolation region 716 both abut an upper surface of the second ILD layer 212, and the isolation region 716 extends vertically therefrom into the second semiconductor substrate 704. In some embodiments, the isolation region 716 may comprise an oxide or an implant isolation region.

A recess 714 is arranged within the second semiconductor substrate 704. The recess 714 comprises substantially vertical sidewalls. A slotted bond pad 226 is arranged within the recess at a location overlying a buffer layer 706. A dielectric layer may be disposed within the recess 714 over the slotted bond pad 226, and a passivation layer 710 may be arranged over the dielectric layer 708. The passivation layer 710 extends along an upper surface of the second semiconductor substrate 704 and the dielectric layer 708. In various embodiments, the passivation layer 710 may comprise a single or multilayer dielectric film including one or more layers of oxide, nitride, and high-k dielectric. A metal connect layer 712 is arranged over the passivation layer 710 and extends into the recess 714 to a position in contact with a slotted bond pad 226. In various embodiments, the metal connect layer 712 may comprise copper or aluminum.

Figure 8:
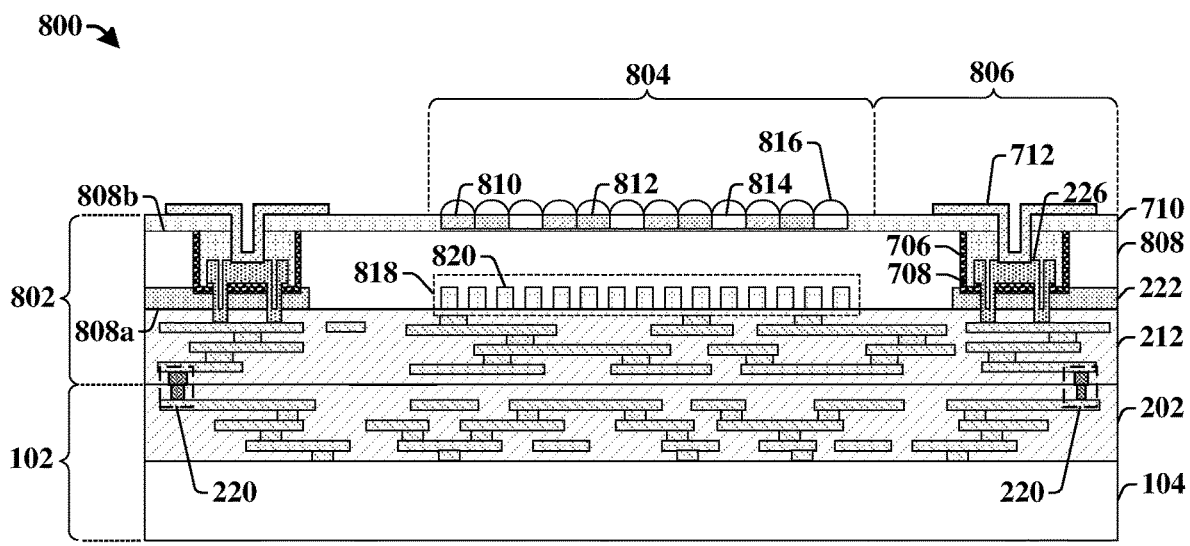
FIG. 8 illustrates some additional embodiments of a back-side illuminated (BSI) image sensor.

FIG. 8 illustrates a cross-sectional view of some embodiments of a back-side illuminated (BSI) image sensor 800.

The BSI image sensor 800 includes a first integrated chip die 102 and a second integrated chip die 802. The second integrated chip die 802 comprises a sensing region 804 and an interconnect region 806. The sensing region 804 is configured to sense incident radiation (e.g., visible light). The interconnect region 806 laterally surrounds the sensing region 804 and comprises bond pads 120 that are configured to connect the BSI image sensor 800 to external devices. The second integrated chip die 802 comprises a second semiconductor substrate 808 having a front-side 808a abutting a second ILD layer 212. An array of pixel sensors 818 are arranged within the front-side 808a of the second semiconductor substrate 808 in the sensing region 804. The array of pixel sensors 818 comprises a plurality of pixel sensors 820. In various embodiments, the plurality of pixel sensors 820 may comprise photodetectors and/or photodiodes.

A passivation layer 710 is arranged along a back-side 808b of the second semiconductor substrate 808. In some embodiments, a metal connect layer 712 is arranged over the passivation layer 710. An array of color filters comprising a plurality of color filters 810-814 is buried in the passivation layer 710, within the sensing region 804. Typically, the plurality of color filters 810-814 have planar upper surfaces that are approximately co-planar with an upper surface of the passivation layer 710. The plurality of color filters 810-814 are configured to transmit assigned colors or wavelengths of radiation to the corresponding pixel sensors 820. In some embodiments, the plurality of color filters 810-814 include blue color filters 810, red color filters 812, and green color filters 814. Micro-lenses 816 are arranged over the plurality of color filters 810-814. The micro-lenses 816 may have centers aligned with centers of the plurality of color filters 810-814. The micro-lenses 816 are configured to focus incident radiation towards the array of pixel sensors 818 and/or the plurality of color filters 810-814. In some embodiments, the micro-lenses 816 have convex upper surfaces.

Figure 9:
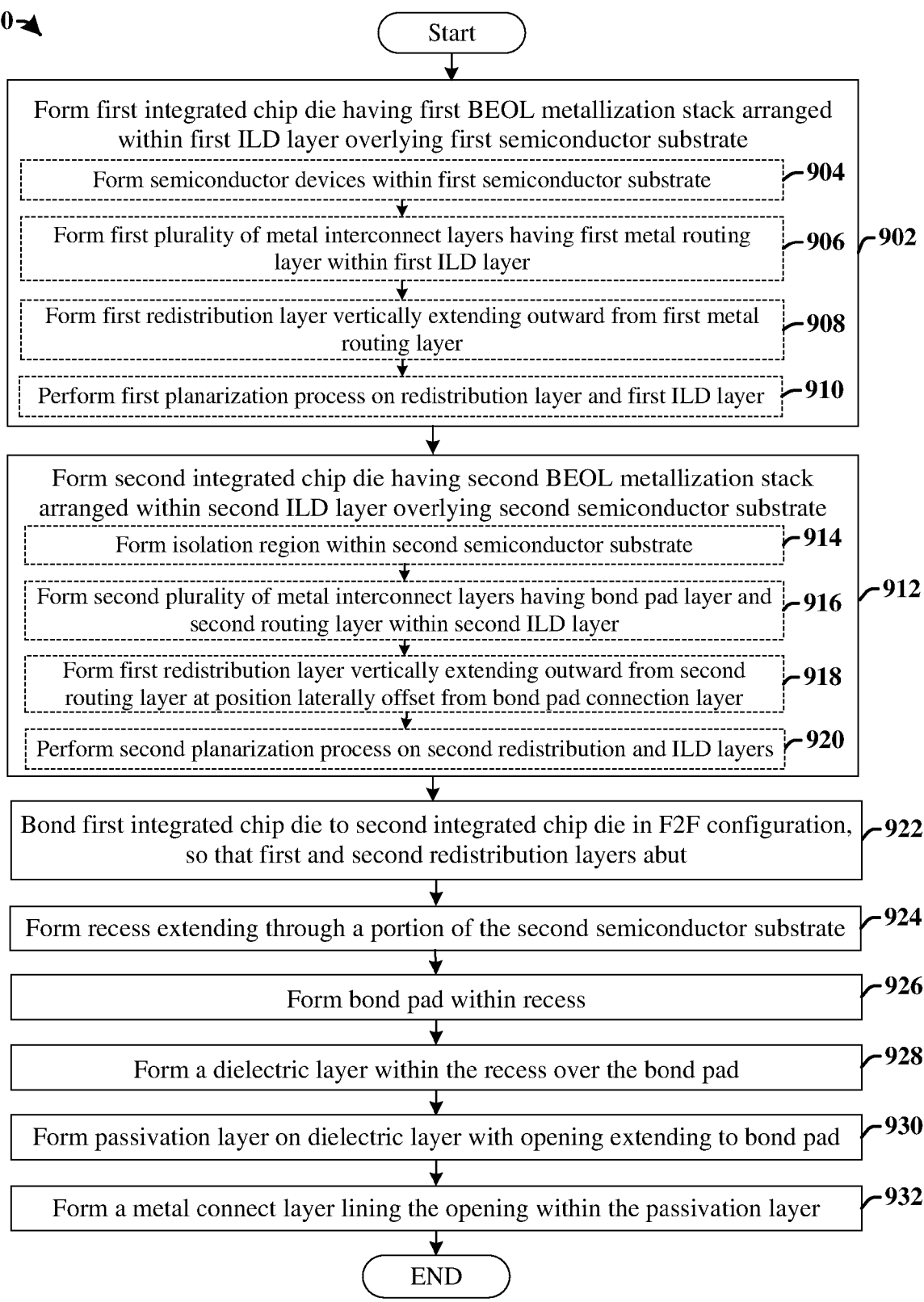
FIG. 9 illustrates a flow diagram of some embodiments of a method of forming a stacked integrated chip having a back-side bond pad.

FIG. 9 illustrates a flow diagram of some embodiments of a method 900 of a forming a stacked integrated chip having a back-side bond pad.

While the disclosed method 900 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 902, a first integrated chip die is formed having a first back-end-of-the-line (BEOL) metallization stack arranged within a first ILD layer overlying a first semiconductor substrate. In some embodiments, the first integrated chip die may be formed according to acts 904-910.

At 904, a plurality of semiconductor devices are formed within the first semiconductor substrate.

At 906, a first plurality of metal interconnect layers are formed within the first ILD layer disposed over the first semiconductor substrate. The first plurality of metal interconnect layers comprise a first metal routing layer extending laterally beyond a bond pad area in which a bond pad is subsequently formed.

At 908, a first redistribution layer is formed in contact with the first metal routing layer at a position laterally offset from the bond pad area.

At 910, a first planarization process is performed to form a first planar interface comprising the first ILD layer and the first redistribution layer.

At 912, a second integrated chip die is formed having a second BEOL metallization stack arranged within a second ILD layer overlying a second semiconductor substrate. In some embodiments, the second integrated chip die may be formed according to acts 914-920.

At 914, an isolation region is formed within the second semiconductor substrate.

At 916, a second plurality of metal interconnect layers are formed within the second ILD layer disposed over the second semiconductor substrate. The second plurality of metal interconnect layers comprise a bond pad layer and a second metal routing layer extending laterally beyond the bond pad area.

At 918, a second redistribution layer is formed in contact with the second metal routing layer at a position laterally offset from the bond pad layer.

At 920, a second planarization process is performed to form a second planar interface comprising the second ILD layer and the second redistribution layer.

At 922, the first integrated chip die is bonded to the second integrated chip die in a face to face (F2F) configuration, so that the first and second redistribution layers abut one another at an interface comprising the first and second ILD layers.

At 924, a recess is formed within the second semiconductor substrate. The recess extends through a portion of the second semiconductor substrate.

At 926, a bond pad is formed within the recess. The bond pad vertically extends to the bond pad connection layer within the second BEOL metallization stack. In some embodiments, the bond pad may comprise a slotted bond pad.

At 928, a dielectric layer is formed within the recess at a position overlying the slotted bond pad.

At 930, a passivation layer is formed over the dielectric layer. The passivation layer has an opening that vertically extends through the passivation layer to the underlying bond pad.

At 932, a metal connect layer is formed onto the passivation layer and within the opening.

FIGS. 10A-17 illustrate some embodiments of cross-sectional views showing a method of a forming a stacked integrated chip having a back-side bond pad. Although FIGS. 10A-17 are described in relation to method 900, it will be appreciated that the structures disclosed in FIGS. 10A-17 are not limited to such a method, but instead may stand alone as structures independent of the method.

FIGS. 10A-10C illustrate some embodiments of cross-sectional views, 1000a-1000c, of an integrated chip corresponding to act 902.

As shown in cross-sectional view 1000a, a plurality of semiconductor devices are formed within a device region 105 of a first semiconductor substrate 104. The first semiconductor substrate 104 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. The semiconductor devices may comprise active (e.g., MOSFETs) and/or passive devices (e.g., capacitor, inductor, resistor, etc.)

As shown in cross-sectional view 1000b, a first plurality of metal interconnect layers 1002 are formed within a first ILD layer 202 disposed over the first semiconductor substrate 104. The first plurality of metal interconnect layers 1002 may be formed by etching the first ILD layer 202 to form openings. The openings are then filled with a conductive material (e.g., tungsten, copper, aluminum, etc.) to form a metal wire 206 and/or a metal via 208. In some embodiments, the first plurality of metal interconnect layers 1002 may be disposed in a bond pad configuration.

As shown in cross-sectional view 1000c, a first metal routing layer 1004 is formed extending outward from a first BEOL metallization stack 204 to a position laterally offset from a bonding area in which a bond pad is subsequently formed. The first metal routing layer 1004 may be formed by etching the first ILD layer 202 to form an opening, which is subsequently filled with a conductive material (e.g., copper, aluminum, etc.).

A first redistribution layer 220a is formed over the first metal routing layer 1004. The first redistribution layer 220a may be formed by etching the first ILD layer 202 to form an opening that is laterally offset from a bond pad area in which a bond pad is subsequently formed. The opening is subsequently filled with a conductive material (e.g., copper, aluminum, etc.). A first planarization process is then performed to form a first planar interface 1006 comprising the first ILD layer 202 and the first redistribution layer 220a. In some embodiments, the first planarization process may cause an upper surface of the first redistribution layer 220a to dish, giving the upper surface a concave curvature.

FIGS. 11A-11C illustrate some embodiments of cross-sectional views, 1100a-1100c, of an integrated chip corresponding to act 910.

As shown in cross-sectional view 1100a, an isolation region 1102 is formed within a second semiconductor substrate 224. The isolation region 1102 is arranged within a front-side 224a of the second semiconductor substrate 224. In some embodiments, the isolation region 1102 is formed by way of a thermal oxidation process. The second semiconductor substrate 224 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith.

As shown in cross-sectional view 1100b, a second plurality of metal interconnect layers 1104 are formed within a second ILD layer 212 disposed over the first semiconductor substrate. The second plurality of metal interconnect layers 1104 may be formed by etching the second ILD layer 212 to form openings. The openings are then filled with a conductive material (e.g., tungsten, copper, aluminum, etc.) to form a metal wire 206 and/or a metal via 208. In some embodiments, the second plurality of metal interconnect layers 1104 may be disposed in a bond pad configuration.

As shown in cross-sectional view 1100c, a second metal routing layer 1106 is formed extending outward from the second BEOL metallization stack 214 to a position laterally offset from the bonding area in which a bond pad is subsequently formed. The second metal routing layer 1106 may be formed by etching the second ILD layer 212 to form an opening. The opening is then filled with a conductive material (e.g., copper, aluminum, etc).

A second redistribution layer 220b is formed over the second metal routing layer 1106. The second redistribution layer 220b may be formed by etching the second ILD layer 212 to form an opening that is laterally offset from the bond pad area. The opening is subsequently filled with a conductive material (e.g., copper, aluminum, etc.). A second planarization process is then performed to form a second planar interface 1108 comprising the second ILD layer 212 and the second redistribution layer 220b. In some embodiments, the second planarization process may cause an upper surface of the second redistribution layer 220b to dish, giving the upper surface a concave curvature.

Figure 12:
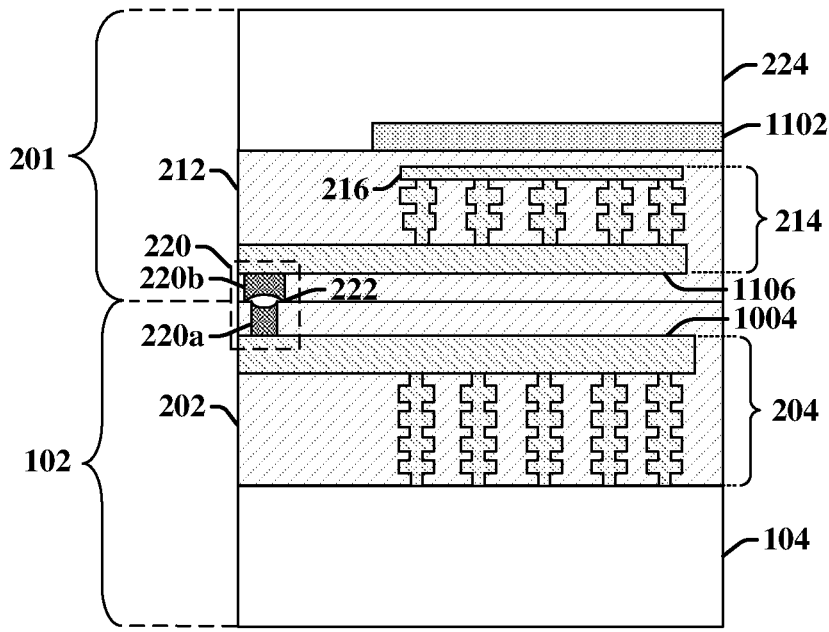

FIG. 12 illustrates some embodiments of a cross-sectional view 1200 of an integrated chip corresponding to act 922.

As shown in cross-sectional view 1200, the first integrated chip die 102 is bonded to the second integrated chip die 201 in a face-to-face (F2F) configuration. In some embodiments, the bonding may comprise bump-less copper to copper bonding at the redistribution layers, 220a and 220b. In other embodiments, the bonding may comprise fusion bonding. In some embodiments, a bubble 222 may form between the first redistribution layer 220a and the second redistribution layer 220b due to dishing caused by the first and second planarization processes. The bubble 222 forms at a location that is laterally offset from a bond pad area in which a bond pad is subsequently formed. In some embodiments, the second semiconductor substrate 224 may be thinned after bonding.

Figure 13:
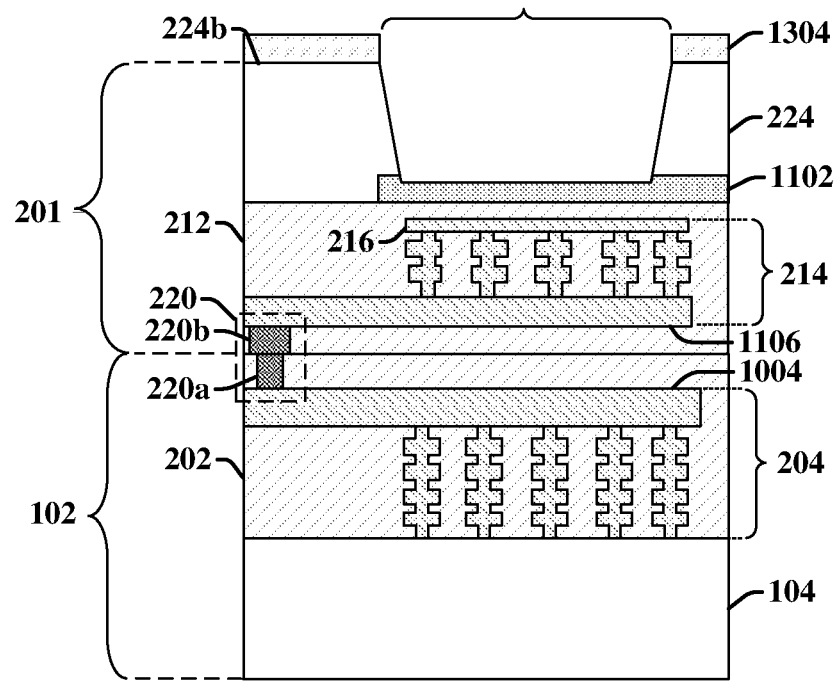

FIG. 13 illustrates some embodiments of a cross-sectional view 1300 of an integrated chip corresponding to act 924.

As shown in cross-sectional view 1300, a back-side 224b of the second semiconductor substrate 224 is selectively exposed to a first etchant 1302. The first etchant 1302 is configured to remove a portion of the second semiconductor substrate 224. In some embodiments, due to over etching, the isolation region 1102 may be eroded by the first etchant 1302. The first etchant 1302 forms a recess 232 in the second semiconductor substrate 224 overlying the bond pad layer 216 and vertically extending to the isolation region 1102. In some embodiments, the recess 232 extends laterally around an array of pixel sensors (not shown). In some embodiments, the second semiconductor substrate 224 may be selectively masked prior to exposure to the first etchant 1302 by a masking layer 1304 (e.g., a photoresist layer). In various embodiments, the first etchant 1302 may comprise a dry etchant have an etching chemistry comprising a fluorine species (e.g., $CF_4$, $CHF_3$, $C_4F_8$, etc.) or a wet etchant (e.g., hydroflouric acid (HF)).

Figure 14A:
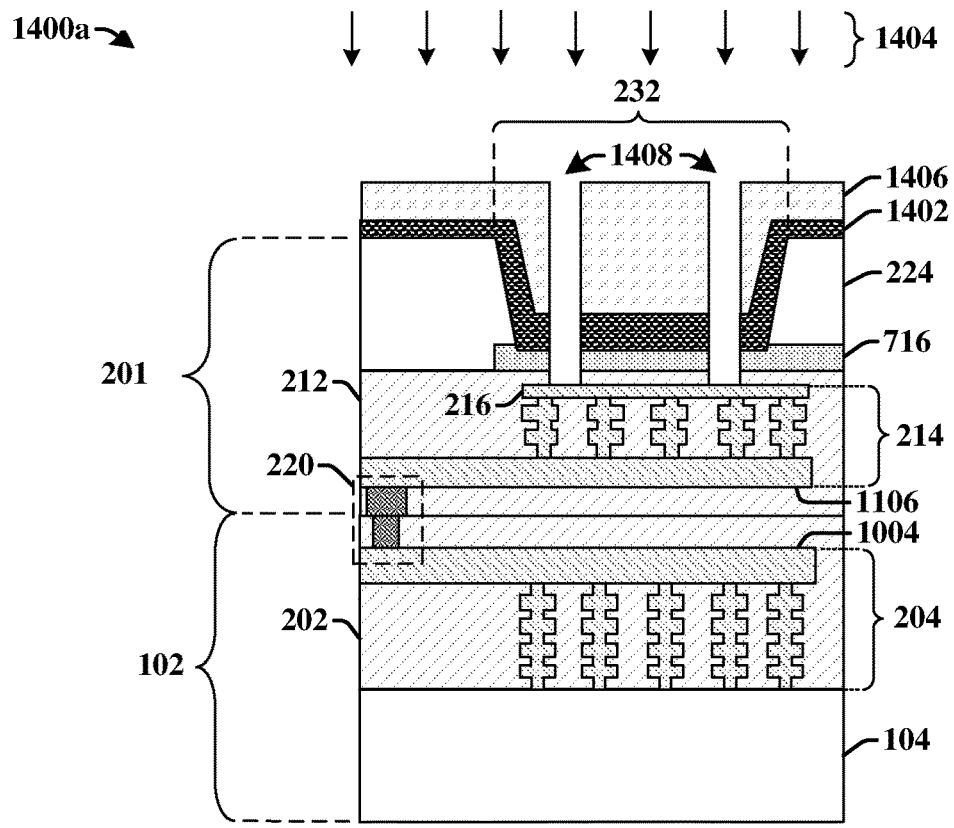
Figure 14B:
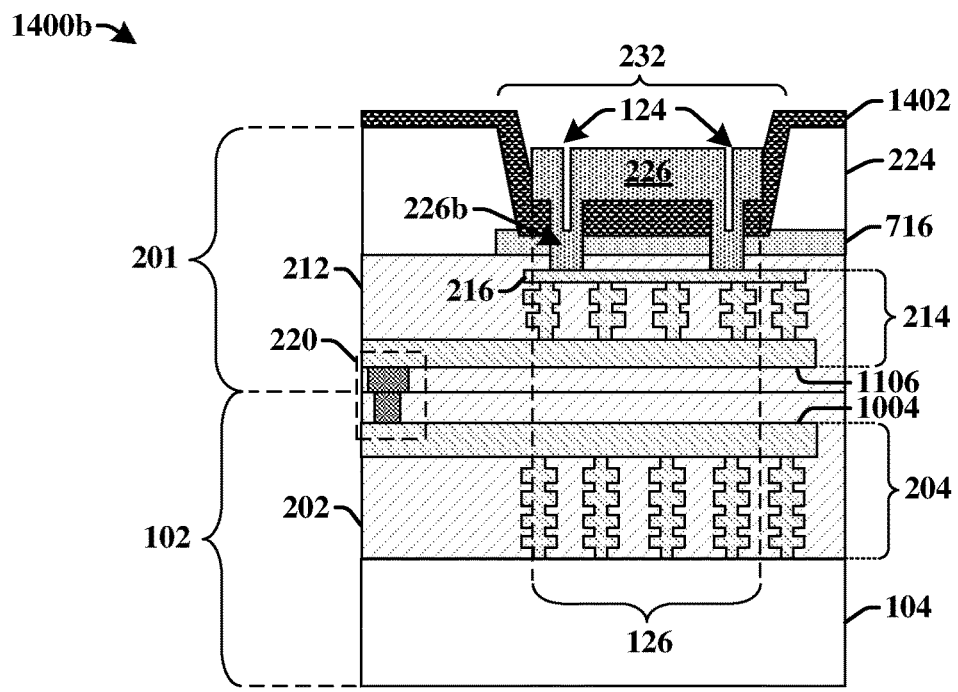

FIGS. 14A-14B illustrate some embodiments of cross-sectional views, 1400a and 1400b, of an integrated chip corresponding to act 926.

As shown in cross-sectional view 1400a, a buffer layer 1402 is formed over the second semiconductor substrate 224 and lining the recess 232. The buffer layer 1402 may be formed using vapor deposition (e.g., chemical vapor deposition (CVD)), thermal oxidation, spin coating, or any other suitable deposition technique. In some embodiments, the buffer layer 1402 may comprise an oxide, such as silicon dioxide.

The workpiece is subsequently exposed to a second etchant 1404. The second etchant 1404 removes portions of the buffer layer 1402, the isolation region 716, and the second ILD layer 212, resulting in trenches 1408 overlying the bond pad layer 216. In some embodiments, the workpiece may be selectively masked prior to exposure to the second etchant 1404 by a masking layer 1406 (e.g., a photoresist layer). In various embodiments, the second etchant 1404 may comprise a dry etchant have an etching chemistry comprising a fluorine species (e.g., $CF_4$, $CHF_3$, $C_4F_8$, etc.) or a wet etchant (e.g., hydroflouric acid (HF)).

As shown in cross-sectional view 1400b, a slotted bond pad 226 is formed over the buffer layer 1402. The slotted bond pad 226 comprises protrusions 226b extending within the trenches 1408 to a position in electrical contact with the underlying bond pad layer 216. In some embodiments, the slotted bond pad 226 may be formed by forming a pad layer over the buffer layer 1402. The pad layer may comprise a metal, such as aluminum copper, copper, aluminum, or some other metal. The pad layer is subsequently etched to form the slotted bond pad 226. The etchant may further form pad openings 124 extending vertically into an upper surface of the pad at a location overlying the protrusions 226b.

Figure 15:
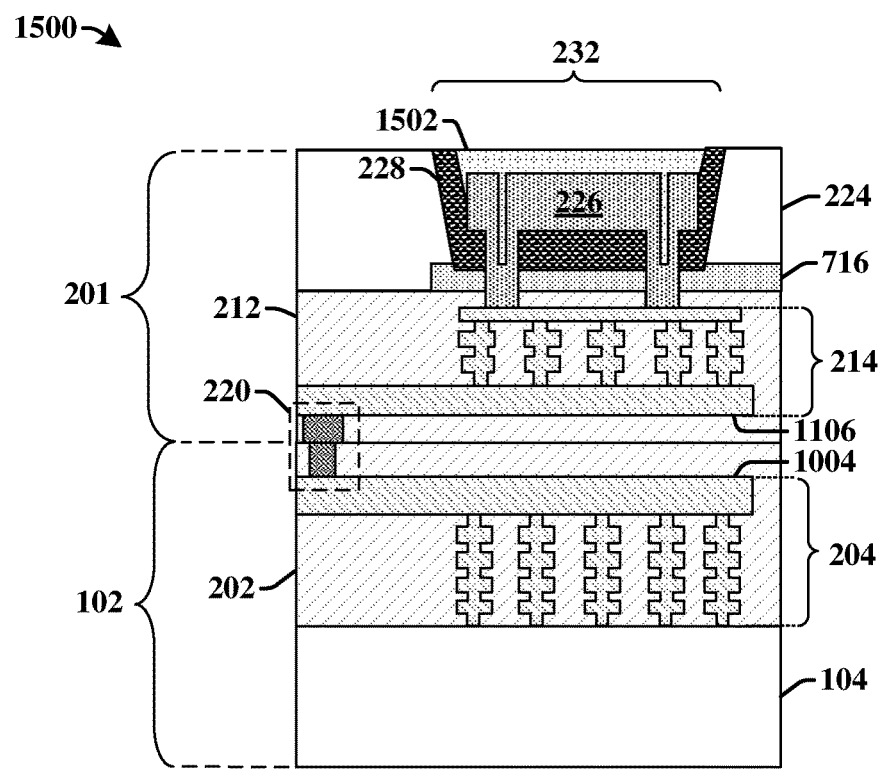

FIG. 15 illustrates some embodiments of a cross-sectional view 1500 of an integrated chip corresponding to act 928.

As shown in cross-sectional view 1500, a dielectric layer 1502 is formed within the recess 232 at a position overlying the slotted bond pad 226 and the buffer layer 228. In various embodiments, the dielectric layer 1502 may be formed using vapor deposition, thermal oxidation, spin coating, or any other suitable deposition technique. In various embodiments, the dielectric layer 1502 may comprise an oxide, such as silicon dioxide, or some other dielectric. In some embodiments, a chemical mechanical polishing (CMP) process may be performed after deposition of the dielectric layer 230.

Figure 16:
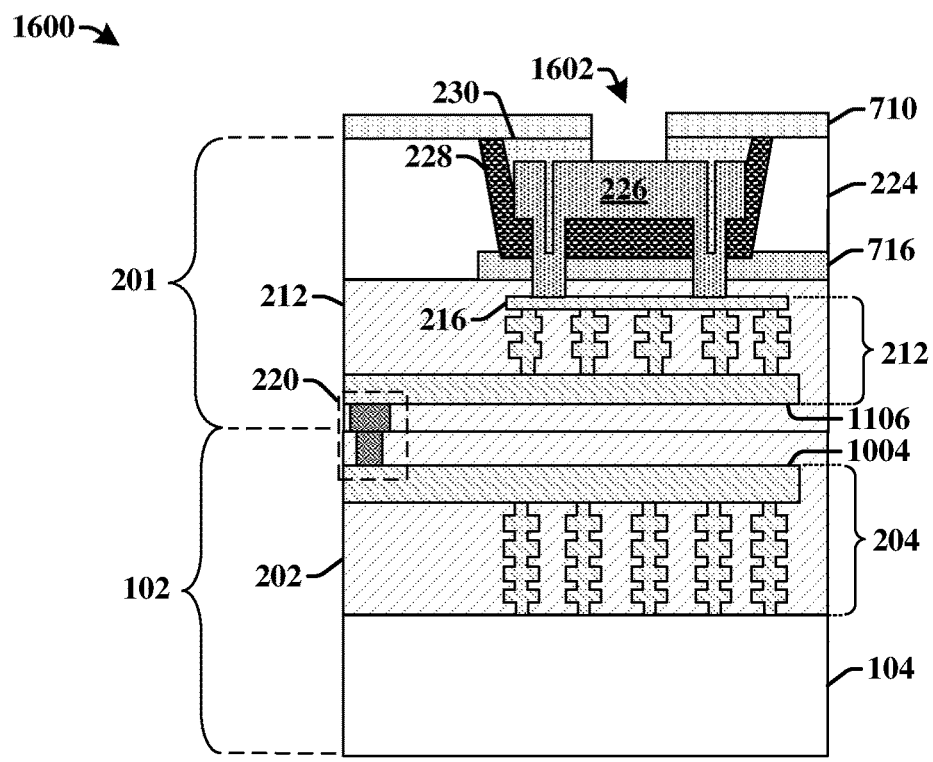

FIG. 16 illustrates some embodiments of a cross-sectional view 1700 of an integrated chip corresponding to act 930.

As shown in cross-sectional view 1600, a passivation layer 710 is formed over the second semiconductor substrate 224 and the dielectric layer 230. The passivation layer 710 may comprise a single or multilayer dielectric film having one or more layers of oxide, nitride, and/or a high-k dielectric. The one or more layers may be formed by sequentially depositing the layers using vapor deposition, thermal oxidation, spin coating, or any other suitable deposition technique. After deposition, the passivation layer 710 and the dielectric layer 230 may be subsequently etched to form an opening 1602 that extends to the underlying slotted bond pad 226.

Figure 17:
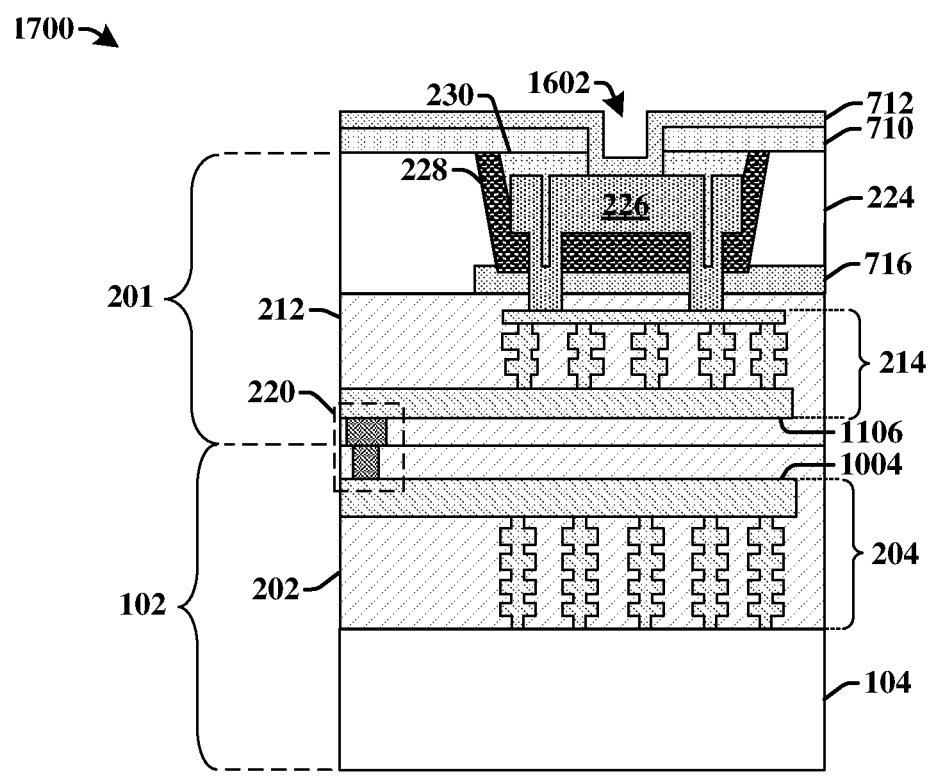

FIG. 17 illustrates some embodiments of a cross-sectional view 1700 of an integrated chip corresponding to act 932.

As shown in cross-sectional view 1700, a metal connect layer 712 is formed over the passivation layer 710 and within the opening 1602. In various embodiments, the metal connect layer 712 may comprise a metal, such as copper or aluminum copper. In various embodiments, the metal connect layer 712 may be formed using, for example, vapor deposition, thermal oxidation, spin coating, or any other suitable deposition technique.

Therefore, the present disclosure relates to a multi-dimensional integrated chip having a redistribution layer vertically extending between integrated chip die, which is laterally offset from a back-side bond pad.

In some embodiments, the present disclosure relates to a multi-dimensional integrated chip. The multi-dimensional integrated chip comprises a first integrated chip die comprising a first plurality of metal interconnect layers arranged within a first inter-level dielectric (ILD) layer disposed onto a front-side of a first semiconductor substrate, and a second integrated chip die comprising a second plurality of metal interconnect layers arranged within a second ILD layer disposed onto a front-side of a second semiconductor substrate, wherein the first ILD layer abuts the second ILD layer. The multi-dimensional integrated chip further comprises a bond pad disposed within a recess extending through the second semiconductor substrate, and a redistribution structure vertically extending between one of the first plurality of metal interconnect layers and one of the second plurality of metal interconnect layers at a position that is laterally offset from the bond pad.

In other embodiments, the present disclosure relates to a multi-dimensional integrated chip. The multi-dimensional integrated chip comprises a first integrated chip die comprising a first inter-level dielectric (ILD) layer disposed onto a front-side of a first semiconductor substrate and surrounding a first plurality of metal interconnect layers comprising a first metal routing layer. The multi-dimensional integrated chip further comprises a second integrated chip die comprising a second ILD layer disposed onto a front-side of a second semiconductor substrate and surrounding a second plurality of metal interconnect layers comprising a bond pad layer vertically separated by one or more metal vias or metal wires from a second metal routing layer. The multi-dimensional integrated chip further comprises a slotted bond pad disposed within a recess extending through the second semiconductor substrate and having protrusions in contact with the bond pad layer. The multi-dimensional integrated chip further comprises a redistribution structure vertically extending between the first metal routing layer and the second metal routing layer at a position that is laterally offset from the slotted bond pad, wherein a bond pad area extending below the slotted bond pad is devoid of redistribution structures extending between the first metal routing layer and the second metal routing layer.

In yet other embodiments, the present disclosure relates to a method of forming a multi-dimensional integrated chip. The method comprises forming a first integrated chip die having a first plurality of metal interconnect layers arranged within a first inter-level dielectric (ILD) layer disposed on a front-side of a first semiconductor substrate, and forming a second integrated chip die having a second plurality of metal interconnect layers arranged within a second ILD layer disposed on a front-side of a second semiconductor substrate. The method further comprises bonding the first integrated chip die to the second integrated chip die so that a first redistribution layer coupled to the first plurality of metal interconnect layers abuts a second redistribution layer coupled to the second plurality of metal interconnect layers at an interface between the first ILD layer and the second ILD layer. The method further comprises forming a recess within a back-side of the second semiconductor substrate, and forming a slotted bond pad within the recess, wherein the slotted bond pad electrically contacts the second plurality of metal interconnect layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. An integrated chip structure, comprising:
a first integrated chip (IC) tier;
a second IC tier comprising a second plurality of conductors within a second insulating structure disposed on a second semiconductor body;
a conductive pad electrically coupled to the second plurality of conductors and having a conductive surface available to a side of the second semiconductor body facing away from the first IC tier; and
wherein the first IC tier contacts the second IC tier along a bonding interface comprising one or more conductive regions and one or more insulating regions, the one or more conductive regions being laterally outside of a bottom surface of the conductive pad.

2. The integrated chip structure of claim 1, wherein the second plurality of conductors comprise a plurality of conductive columns laterally separated from one another by the second insulating structure, the plurality of conductive columns respectively comprising one or more interconnect wires and one or more interconnect vias.

3. The integrated chip structure of claim 2, wherein the plurality of conductive columns are laterally spaced apart from one another by substantially equal distances.

4. The integrated chip structure of claim 1, wherein the first IC tier comprises a plurality of copper interconnect layers arranged within a plurality of inter-level dielectric layers stacked onto a first semiconductor body.

5. The integrated chip structure of claim 1, wherein the conductive pad comprises one or more protrusions formed by sidewalls extending outward from a lower surface of the conductive pad, the bottom surface arranged along a bottom of the one or more protrusions.

6. An integrated chip structure, comprising:
a first plurality of interconnects arranged within a first ILD structure on a first substrate;
a second plurality of interconnects arranged within a second ILD structure between the first ILD structure and a second substrate, wherein the second plurality of interconnects comprise a first interconnect and a second interconnect arranged at a same vertical distance from the second substrate, the second interconnect being laterally separated from the first interconnect;
a bonding structure disposed on the second plurality of interconnects; and
a connector structure vertically between the first plurality of interconnects and the second plurality of interconnects, wherein the first interconnect is directly below the bonding structure and the second interconnect directly contacts the connector structure.

7. The integrated chip structure of claim 6, wherein the second interconnect laterally extends past an outermost sidewall of the connector structure.

8. The integrated chip structure of claim 6, wherein the bonding structure directly contacts an interconnect wire that is a closest interconnect wire to the second substrate, the interconnect wire being surrounded by an inter-level dielectric (ILD) layer.

9. The integrated chip structure of claim 8, wherein the ILD layer comprises a low-k or an ultra-low k dielectric material.

10. The integrated chip structure of claim 6,
wherein the first plurality of interconnects comprise a third interconnect and a fourth interconnect arranged at equal vertical distances from the first substrate, the third interconnect being laterally separated from the fourth interconnect.

11. The integrated chip structure of claim 6, wherein the first interconnect is a first rectangular interconnect and the second interconnect is a second rectangular interconnect, the first rectangular interconnect connected to the second rectangular interconnect by a plurality of interconnect extensions extending between the first rectangular interconnect and the second rectangular interconnect.

12. The integrated chip structure of claim 11, wherein the first rectangular interconnect has a larger area than the second rectangular interconnect.

13. An integrated chip structure, comprising:
a first plurality of interconnects arranged within a first ILD structure on a first substrate;
a second plurality of interconnects arranged within a second ILD structure between the first ILD structure and a second substrate;
a bonding structure disposed on the second plurality of interconnects, wherein the bonding structure physically contacts an interconnect wire of the second plurality of interconnects; and
a connector structure vertically between the first plurality of interconnects and the second plurality of interconnects, wherein the connector structure is laterally outside of the interconnect wire and wherein the connector structure comprises a first connector disposed within the first ILD structure and a second connector disposed within the second ILD structure, the first connector and the second connector having outermost sidewalls that are laterally offset from one another.

14. The integrated chip structure of claim 13, wherein the connector structure is laterally offset from the interconnect wire by a non-zero distance.

15. The integrated chip structure of claim 13, wherein the interconnect wire is a closest interconnect wire to the second substrate.

16. The integrated chip structure of claim 15, wherein the second plurality of interconnects further comprise a plurality of metal wires and metal vias arranged within a plurality of column-like structures laterally separated from one another, the plurality of column-like structures physically contacting the interconnect wire.

17. The integrated chip structure of claim 16, wherein the connector structure physically contacts a second interconnect wire that is on a second interconnect wire layer of the second plurality of interconnects, the second interconnect wire layer being on a furthest interconnect wire layer from the second substrate and the plurality of column-like structures physically contacting the second interconnect wire layer.

18. The integrated chip structure of claim 13, wherein the connector structure comprises a first segment having a first width and a second segment having a second width larger than the first width.

19. The integrated chip structure of claim 17, wherein a segment of the first ILD structure that is laterally between neighboring ones of the plurality of column-like structures continuously and vertically extends between the interconnect wire and the second interconnect wire.

20. The integrated chip structure of claim 18, wherein the first segment is closer to the first substrate than the second segment.

* * * * *